US012035538B2

(12) United States Patent
Chin et al.

(10) Patent No.: US 12,035,538 B2
(45) Date of Patent: Jul. 9, 2024

(54) METHOD OF FORMING MEMORY DEVICE WITH PHYSICAL VAPOR DEPOSITION SYSTEM

(71) Applicant: TAIWAN SEMICONDUCTOR MANUFACTURING COMPANY, LTD., Hsinchu (TW)

(72) Inventors: I-Pin Chin, Hsinchu (TW); Yu-Jen Chien, Hsinchu (TW); Chin-Szu Lee, Taoyuan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 169 days.

(21) Appl. No.: 17/461,554

(22) Filed: Aug. 30, 2021

(65) Prior Publication Data

US 2023/0066036 A1    Mar. 2, 2023

(51) Int. Cl.
*H10B 61/00* (2023.01)
*C23C 16/455* (2006.01)
*G11C 11/16* (2006.01)
*H01L 21/67* (2006.01)

(52) U.S. Cl.
CPC ....... *H10B 61/00* (2023.02); *C23C 16/45536* (2013.01); *G11C 11/161* (2013.01); *H01L 21/67017* (2013.01)

(58) Field of Classification Search
CPC . H10B 61/00; C23C 16/45536; G11C 11/161; H01L 21/67017
See application file for complete search history.

(56) References Cited

U.S. PATENT DOCUMENTS

| | | | | |
|---|---|---|---|---|
| 6,641,701 | B1 * | 11/2003 | Tepman | H01J 37/3497 204/192.12 |
| 2008/0023318 | A1 * | 1/2008 | Kuroiwa | C23C 14/35 204/192.1 |
| 2009/0139854 | A1 * | 6/2009 | Chang | H01J 37/3455 204/298.03 |
| 2010/0032289 | A1 * | 2/2010 | Wang | H01J 37/32027 204/192.12 |
| 2015/0104882 | A1 * | 4/2015 | Jung | H10B 61/00 438/3 |
| 2018/0308899 | A1 * | 10/2018 | Chuang | H10N 50/01 |
| 2019/0165258 | A1 * | 5/2019 | Peng | H10N 50/80 |
| 2020/0106007 | A1 * | 4/2020 | Peng | H10B 61/10 |
| 2021/0066579 | A1 * | 3/2021 | Wang | H10N 50/80 |

\* cited by examiner

*Primary Examiner* — Shih Tsun A Chou
(74) *Attorney, Agent, or Firm* — Birch, Stewart, Kolasch & Birch, LLP

(57) ABSTRACT

A method of forming a memory device includes forming a dielectric structure over a wafer. A bottom electrode via is formed in the dielectric structure. A plasma deposition process is performed to deposit a bottom electrode layer over the bottom electrode via and performing the plasma deposition process includes off-axis rotating a magnet over the wafer to control plasma of the plasma deposition process. A memory material layer and a top electrode layer are formed over the bottom electrode layer. The bottom electrode layer, the memory material layer, and the top electrode layer are patterned to respectively form a bottom electrode, a memory layer, and a top electrode.

20 Claims, 12 Drawing Sheets

METHOD OF FORMING MEMORY DEVICE WITH PHYSICAL VAPOR DEPOSITION SYSTEM

BACKGROUND

In the semiconductor integrated circuit (IC) industry, technological advances in IC materials and design have produced generations of ICs where each generation has smaller and more complex circuits than the previous generation. In the course of IC evolution, functional density (i.e., the number of interconnected devices per chip area) has generally increased as a result of decreasing minimum feature size or geometry sizes (i.e., the smallest component (or line) that can be created using a fabrication process). Such scaling down has also increased the complexity of IC processing and manufacturing.

Physical vapor deposition (PVD) is commonly used within the semiconductor industry, as well as within solar, glass coating, and other industries. A PVD system is to deposit some layers (e.g., metal layers) onto substrates such as semiconductor wafers that is positioned in a vacuum plasma chamber. A PVD process is used to deposit a target material onto the semiconductor wafer. In a PVD system, the target materials to be coated are disposed in a vacuum chamber containing an inert gas such as argon.

BRIEF SUMMARY

According to some embodiments, a method of forming a memory device includes forming a dielectric structure over a wafer. A bottom electrode via is formed in the dielectric structure. A plasma deposition process is performed to deposit a bottom electrode layer over the bottom electrode and performing the plasma deposition process includes off-axis rotating a magnet over the wafer to control plasma of the plasma deposition process. A memory material layer and a top electrode layer are formed over the bottom electrode layer. The bottom electrode layer, the memory material layer, and the top electrode layer are patterned to respectively form a bottom electrode, a memory layer, and a top electrode.

According to some embodiments, a method of forming a bottom electrode via over a wafer. A bottom electrode layer is deposited over the bottom electrode via by using a deposition apparatus, in which the deposition apparatus includes a target and a magnet, and a portion of the magnet does not overlap with the target in a vertical direction. A magnetic tunnel junction (MTJ) layer and a top electrode layer are formed over the bottom electrode layer. The bottom electrode layer, the MTJ layer, and the top electrode layer are patterned to respectively form a bottom electrode, a memory layer, and a top electrode.

According to some embodiments, a deposition apparatus includes a chamber, a wafer pedestal, a carrier structure, and a magnet. The chamber is surrounded by a shield structure. The wafer pedestal is configured to support a wafer within the chamber. The carrier structure is positioned over the chamber, and the carrier structure configured to support a target. The magnet is positioned above the chamber, in which a center of the magnet is spaced apart from a center of the chamber.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
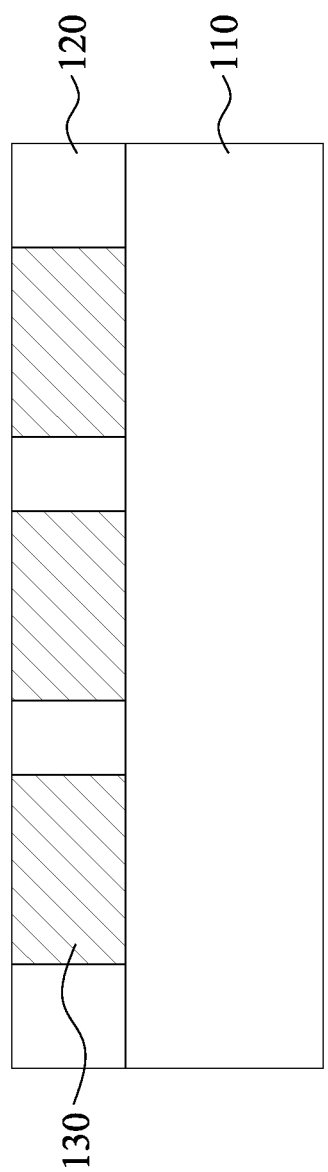
FIG. 1 to FIG. 10 illustrate a method for manufacturing a memory device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about", "approximately", or "substantially" shall generally mean within 20 percent, or within 10 percent, or within 5 percent of a given value or range. Numerical quantities given herein are approximated, meaning that the term "around", "about", "approximately", or "substantially" can be inferred if not expressly stated.

Some embodiments of this disclosure relate to a method of forming a memory device and more specifically to improve deposition uniformity of a bottom electrode layer of the memory device. Because the bottom electrode layer is uniformly deposited over a wafer, high bit error rate (BER) can be prevented or avoided and thus performance of the memory device can be also improved.

FIG. 1 to FIG. 10 illustrate a method for manufacturing a memory device at various stages in accordance with some embodiments of the present disclosure. Reference is made to FIG. 1. A wafer 110 is provided. In some embodiments, the wafer 110 is a substrate. In some other embodiments, the wafer 110 includes a substrate and a logic circuit over the substrate. The substrate may be a silicon substrate. Alternatively, the substrate may include another elementary semiconductor, such as germanium; a compound semiconductor including silicon carbide; an alloy semiconductor including silicon germanium; or combinations thereof. In some embodiments, the substrate is a semiconductor on insulator (SOI) substrate. The substrate may include doped regions, such as p-wells and n-wells. In some embodiments, the wafer 110 is a workpiece that includes the substrate and various features formed in and over and attached to the substrate. In some embodiments, the logic circuit includes transistors formed by transistor fabrication processes and may be planar transistors, such as polysilicon gate transistors or high-k metal gate transistors, or multi-gate transistors, such as fin field effect transistors or gate-all-around transistors.

A dielectric layer 120 is then formed over the wafer 110. In some embodiments, the dielectric layer 120 may include, for example, silicon oxide, low-k silicon oxide such as a porous silicon oxide layer, other suitable dielectric material, combinations thereof, or the like. In some embodiments, the dielectric layer 120 is a low-k dielectric layer made from extra low-k materials, extreme low-k materials, combinations thereof, or the like. In some embodiments, the dielectric layer 120 may have a dielectric constant lower than 2.4. In various examples, the dielectric layer 120 may be deposited by an ALD process, a CVD process, a subatmospheric CVD (SACVD) process, a flowable CVD process, a PVD process, or other suitable process.

Thereafter, a plurality of conductive features 130 are formed in the dielectric layer 120 for interconnecting memory cells (which will be discussed subsequently) and the wafer 110. In some embodiments, the method of forming the conductive features 130 may include etching the dielectric layer 120 to form trenches, and then filling conductive materials into the trenches to form the conductive features 130. In some embodiments, a planarization process, such as a CMP process, may be performed to remove excess materials. In some embodiments, the conductive features 130 include copper or copper alloys. In some other embodiments, the conductive features 130 include aluminum, tungsten, carbon, cobalt, TaN, or other suitable conductive materials. In still some other embodiments, each of the conductive features 130 may be a bilayer structure (e.g., a barrier layer and a filling metal layer formed on the barrier layer).

Figure 2:
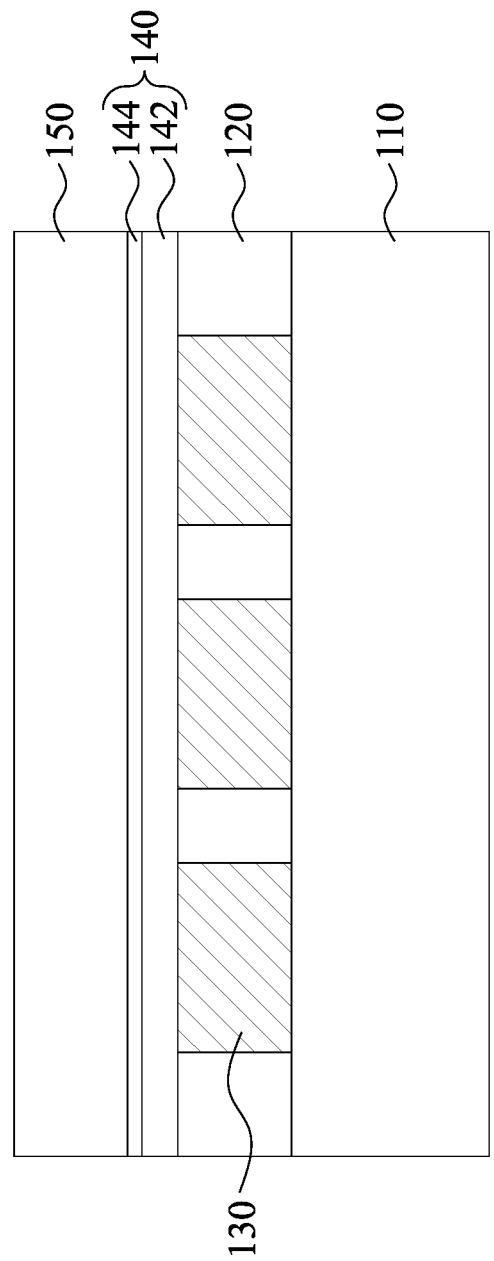

Reference is made to FIG. 2. After the conductive features 130 are formed, a blocking layer 140 is formed over the dielectric layer 120 and conductive features 130. The blocking layer 140 is formed by a suitable process such as physical vapor deposition (PVD), sputtering, chemical vapor deposition (CVD), atomic layer deposition (ALD), or combinations thereof. In some embodiments, the blocking layer 140 is a bilayer structure. For example, the blocking layer 140 includes a first blocking layer 142 and a second blocking layer 144 over the first blocking layer 142. The first blocking layer 142 may be a silicide-blocking layer, and may also be referred to as a silicidation-blocking layer. The first blocking layer 142 may include a dielectric material such as silicon oxide, silicon nitride, or other suitable materials. The second blocking layer 144 may include metal oxide, such as aluminum oxide, or other suitable materials. In some embodiments, the first blocking layer 142 has a thickness greater than that of the second blocking layer 144.

Thereafter, a dielectric structure 150 is formed over the blocking layer 140. The dielectric structure 150 may be made of low-k dielectric material, such as tetraethylorthosilicate (TEOS)-formed oxide, or other suitable materials. In some embodiments, the dielectric structure 150 includes silicon oxide layer, silicon nitride layer or silicon oxynitride layer, and the like. For example, the dielectric structure 150 includes a TEOS-formed oxide layer and a nitrogen-free anti-reflective coating layer (NFARL) over the TEOS-formed oxide layer. In some embodiments, nitrogen in the ARC layer may chemically alter the composition of the photoresist material. The chemical reaction between nitrogen and the photoresist material is referred to as photoresist poisoning. The altered photoresist material may not be lithographically patterned as expected and result in imprecisely formed features in the photoresist material, which can detrimentally affect subsequent processes, such as etching processes. Therefore a nitrogen free anti-reflection layer (NFARL) is used as the ARC over the TEOS-formed oxide layer. The dielectric structure 150 may be formed by CVD, plasma enhanced CVD (PECVD), ALD, flowable CVD (FCVD), or other suitable methods.

Figure 3:
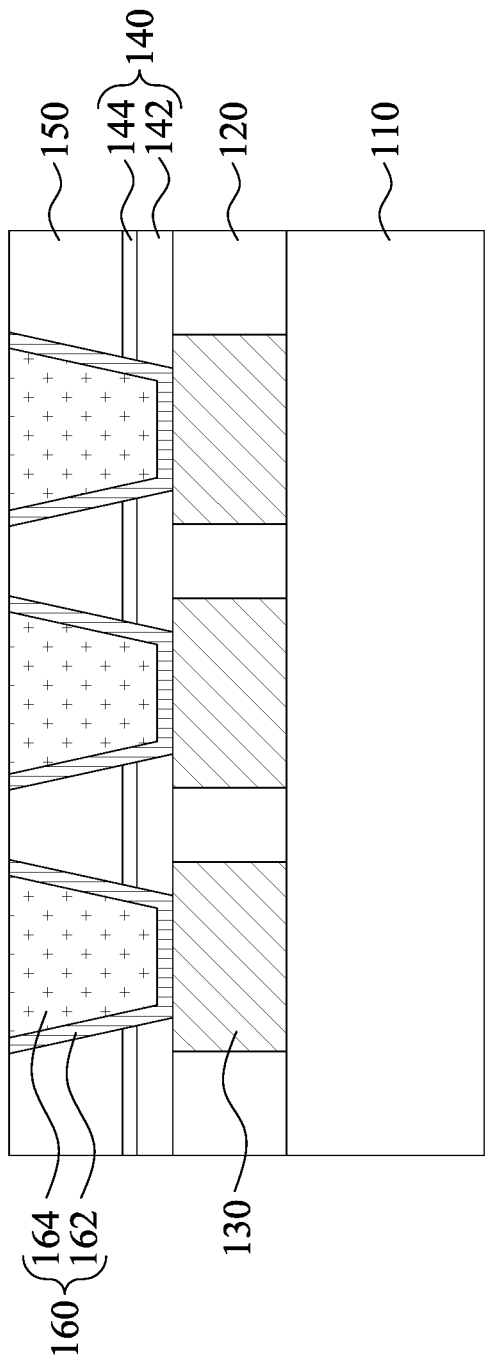

Reference is made to FIG. 3. A plurality of bottom electrode vias 160 are formed in the blocking layer 140 and the dielectric structure 150. The bottom electrode vias 160 are electrically connected to the conductive features 130. In some embodiments, the method of forming the bottom electrode vias 160 may include etching the blocking layer 140 and the dielectric structure 150 until exposing the conductive features 130 to form via openings on the wafer 110, and then filling conductive materials into the via openings to form the bottom electrode vias 160. In some embodiments, a planarization process, such as a CMP process, may be performed to remove excess materials.

In some embodiments, each of the bottom electrode vias 160 includes a barrier layer 162 and a metal filling layer 164, in which the barrier layer 162 is conformally formed in the via openings and the metal filling layer 164 is formed over the barrier layer 162. The barrier layer 162 can improve the adhesion between the conductive features 130 and a material formed thereon (such as the metal filling layer 164), or prevent a diffusion of a metal from diffusing from the via into the dielectric structure 150. In some embodiments, the barrier layer 162 may include metal nitride materials. For example, the barrier layer 162 includes Ta, TaN, or other suitable materials. In some embodiments, the barrier layer 162 includes a single layer or multiple layers. For a multiple-layer configuration, the layers include different compositions of metal nitride from each other. The metal filling layer 164 is formed over the barrier layer 162. In some embodiments, a blanket anti-reflective coating layer and a filling material layer are sequentially formed in the blocking layer 140 and the dielectric structure 150, and excessive portions of the filling material layer and the blanket barrier layer are removed by performing a CMP process to form the metal filling layer 164 and the barrier layer 162. The metal filling layer 164 may be made of Ti, TiN, or other suitable materials.

Figure 4:
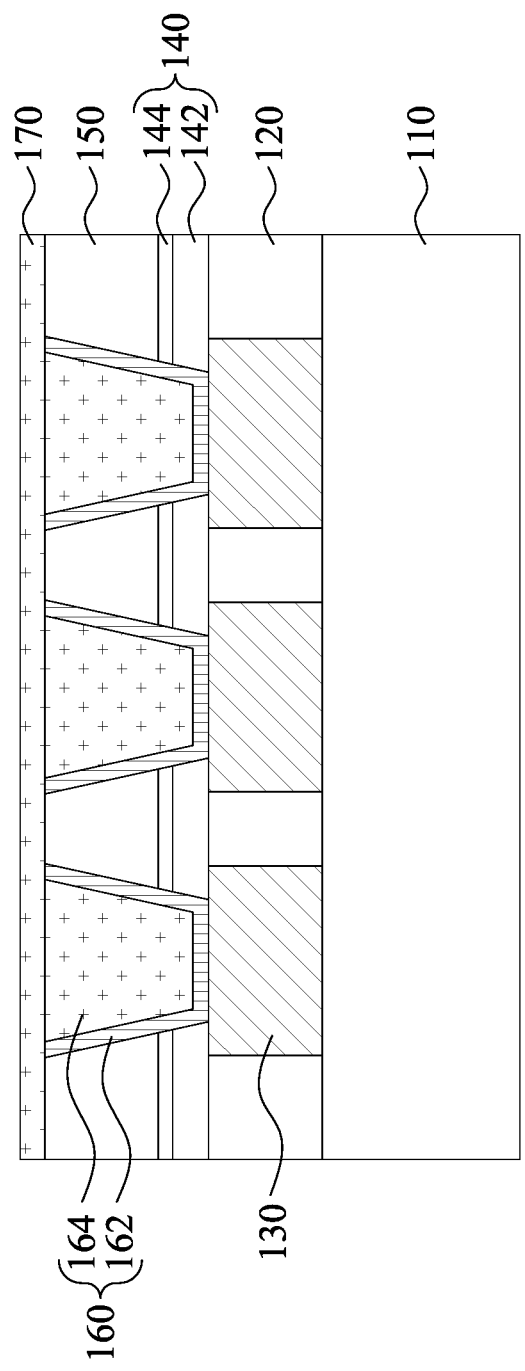

Reference is made to FIG. 4. A bottom electrode layer 170 is formed over the bottom electrode vias 160 by using a deposition method. The bottom electrode layer 170 covers the dielectric structure 150 and the bottom electrode vias 160. The bottom electrode layer 170 is in contact with the dielectric structure 150, the barrier layer 162 and the metal filling layer 164. In some embodiments, the bottom electrode layer 170 include metal materials, such as titanium nitride (TiN), copper (Cu), aluminum (Al), titanium (Ti), tantalum (Ta), tungsten (W), ruthenium (Ru), tantalum nitride (TaN), titanium, the like, and/or combinations thereof. In some other embodiments, the bottom electrode layer 170 includes non-metal materials, such as silicon (Si).

The deposition process for forming the bottom electrode layer 170 can be performed by using a physical vapor deposition system, in which a rotation axis is spaced apart from a center axis of a magnet, as described in greater detail below.

Figure 11:
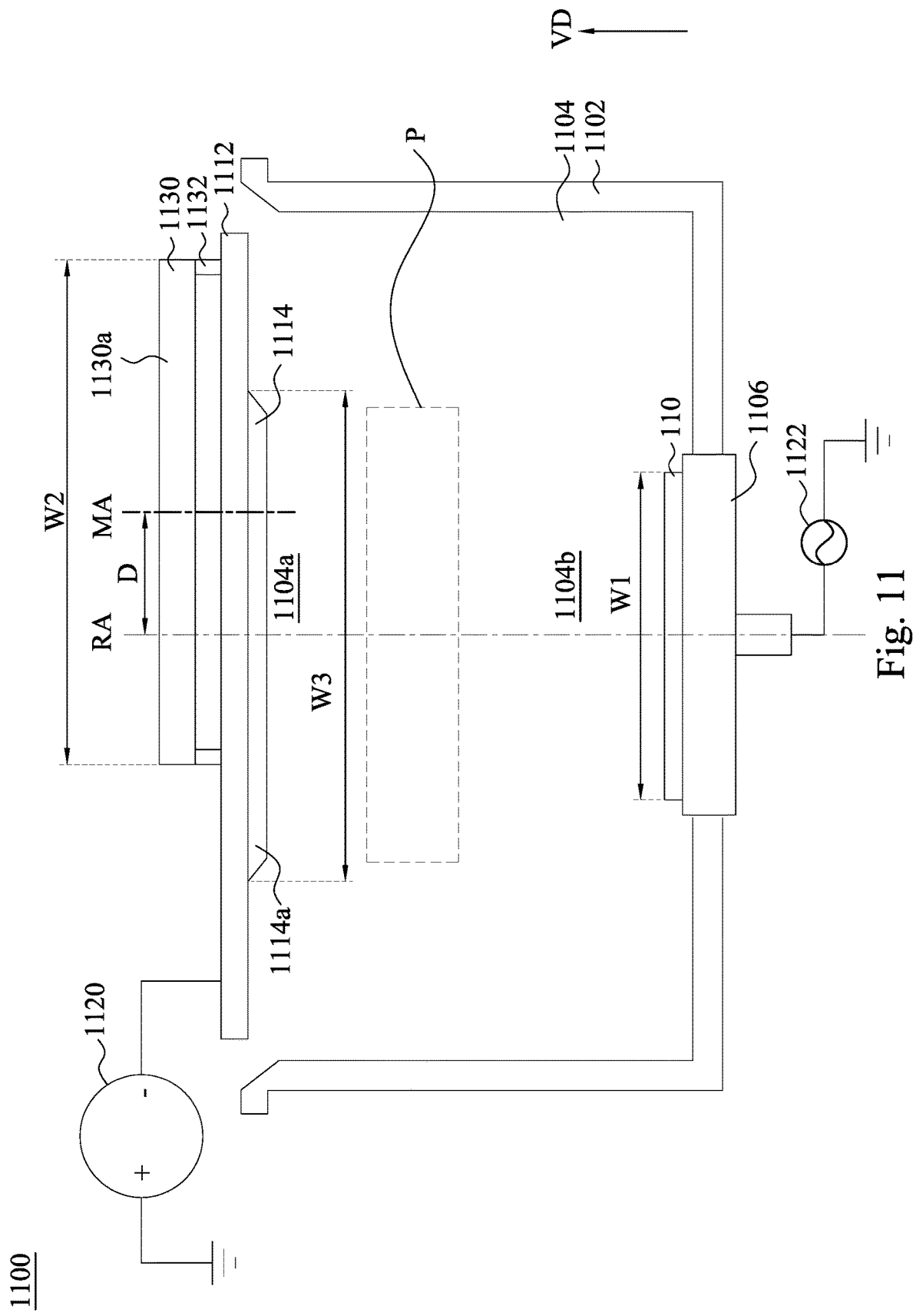
FIG. 11 is a schematic diagram of the fabrication apparatus in accordance with some embodiments of the present disclosure.

FIG. 11 is a schematic diagram of a physical vapor deposition apparatus 1100, according to some embodiments of the present disclosure. Reference is made to FIGS. 4 and 11. In some embodiments, the structure in FIG. 3 (i.e., the wafer 110 and layers formed above) may undergo a deposition process in the physical vapor deposition apparatus 1100 of FIG. 11 and then forming the bottom electrode layer 170.

The physical vapor deposition apparatus 1100 shown in FIG. 11 includes a containment shield 1102, a chamber 1104, a wafer pedestal 1106, and power supplies 1120 and 1122. The containment shield 1102 is configured to form/define the chamber 1104. The chamber 1104 includes an upper portion 1104a and a lower portion 1104b. The wafer 110 is supported and brought into position in the lower chamber 104b by the wafer pedestal 1106. It is noted that the wafer 110 in FIG. 11 is substantially the same as the wafer 110 in FIG. 3, wherein the multiple layers/structures (e.g., the dielectric layer 120, the conductive features 130, the blocking layer 140, the dielectric structure 150, and the bottom electrode vias 160) over the wafer 110 are omitted in FIG. 11 for clarify. In some embodiments, the wafer pedestal 1106 is an electrostatic chuck, or e-chuck. For example, clamps may be positioned over the edges of the wafer 110 to help secure it in place. In some embodiments, the wafer pedestal 1106 may have a temperature control and maintenance system incorporated therein that allows a temperature of the wafer 110 to be controlled. For example, the wafer pedestal 1106 may be used to cool the wafer 110 as the chamber 1104 may be heated for and by the production of a plasma P therein. Regulating the temperature of the wafer 110 may improve characteristics of the deposited material layer and increase the deposition rate by promoting condensation.

Opposite the wafer 110 and the wafer pedestal 1106 and above the upper portion 1104a of the chamber 1104 there is a carrier structure 1112 that supports a target 1114. The carrier structure 1112 secures the target 1114 (e.g., fixed the target 1114 on the carrier structure 1112) during the deposition process. The target 1114 is a piece of material from which the material layer (e.g., the bottom electrode layer 170 in this case) on the wafer 110 is to be formed. The target 1114 may be a conductive material that reacts with a gas to form a molecule from which the deposited material layer (e.g., the bottom electrode layer 170 in this case) is made. For example, the target 1114 includes metal (e.g., titanium, aluminum, tantalum, copper, or other suitable target material).

The power supplies 1120 and 1122 are provided in the physical vapor deposition apparatus 1100 in order to generate and control the plasma within the chamber 1104 and to direct the deposition, as desired. In greater details, the direct current (DC) power supply 1120 is coupled to the carrier structure 112 to supply DC power to it. The radiofrequency alternating current (RF) power supply 1122 is coupled to the wafer pedestal 1110. In some embodiments, an RF power supply is also provided to the carrier structure 1112 in addition to the DC power supply 1120. In some embodiments, the power supply 1122 provides about 500 W or more to the wafer pedestal 1106. In some embodiments, the power supply 1122 provides about 20 kW or more to the carrier structure 1112 and the target 1114.

Plasma P is generated in the physical vapor deposition apparatus 1100 by introducing a plasma feed gas, such as argon, into the chamber 1104. Electrons provided by the power supplies 1120 and 1122 collide with atoms of the plasma feed gas to create ions. The negative bias applied by the power supply 1120 attracts the ions towards the target 1114. The ions collide with the target 1114 with high energy. In other words, the negative bias on the carrier structure 1112 accelerates positive ions of the formed plasma P towards the target 1114 to sputter atoms from the target 1114. The sputtered atoms are dislodged from the surface of the target 1114 by direct momentum transfer. The sputtered atoms may or may not become ionized, and a subset of them is deposited onto the wafer 110.

In some embodiments, the physical vapor deposition apparatus 1100 can further include a magnet 1130 disposed over the carrier structure 1112 for generating magnetic fields in the chamber 1104. In greater details, the magnet 1130 is fixed on the carrier structure 1112 by the magnet holder 1132. The magnet 1130 and the target 1114 are disposed on opposite sides of the carrier structure 1112. The magnetic fields are used to increase a residence time of the electrons by causing the electrons to spiral through the plasma P. By varying the shape of the magnetic fields of the magnet 1130, the plasma can be directionally controlled. Therefore, ionization levels of the plasma feed gas also increase. In some embodiments, the magnet 1130 may be coaxial electromagnetic coils (including solenoids), as well as appropriate arrangements of permanent magnets, and combinations of electromagnetic coils and permanent magnets. A DC and/or a radio frequency (RF) bias can be applied to the magnet 1130 to generate the magnetic fields. Plasma uniformity, particularly uniformity of the plasma near the wafer 110, is controlled by the magnet 1130 and supplied with RF and/or DC bias. Moreover, since the wafer 110 is usually a circular wafer, concentric electromagnetic coils may be used.

Figure 12:
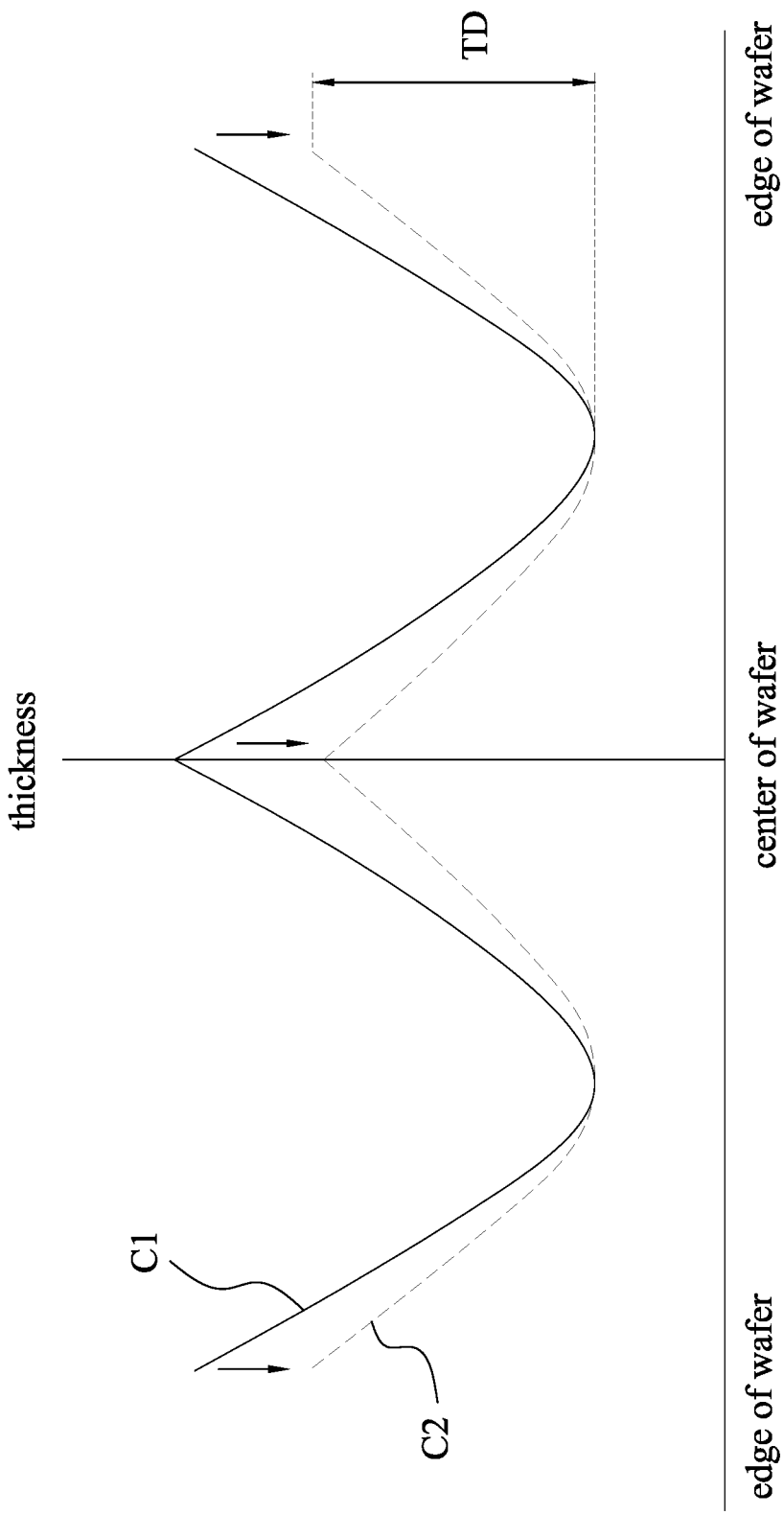
FIG. 12 is a schematic diagram to illustrate a result of comparing profiles of a bottom electrode layer in accordance with some embodiments of the present disclosure.

The physical vapor deposition apparatus 1100 is used to deposit the bottom electrode layer 170 over the wafer 110. The magnet 1130 has a center axis MA passing through a center of the magnet 1130 and perpendicular to a top surface or a bottom surface of the magnet 1130, and the magnet 1130 can off-axis rotate along a rotation axis RA. It is noted that the "off-axis" herein means that the center axis MA of the magnet 1130 is misaligned with the rotation axis RA. For example, the magnet holder 1132 holds the magnet 1130 and is configured to rotate the magnet 1130 along the rotation axis RA of the magnet holder 1132 (or of the magnet 1130). In some embodiments, the rotation axis RA passes through the center of the wafer 110, the center of the chamber 1104, the center of the carrier structure 1112, and/or the center of the target 1114. In some embodiments, as shown in FIG. 12, which is a result of comparing profiles of the bottom electrode layer when the rotation axis of the magnet is aligned or misaligned with the center axis of the magnet, when the rotation axis RA is equal to or aligned with the center axis MA, a deposition amount of a central region of the bottom electrode layer 170 at the center of the wafer 110 and a deposition amount of an edge region of the bottom electrode layer 170 at edges of the wafer 110 would be greater than the other regions (i.e., the regions between the central region and the edge region) of the bottom electrode layer 170 (curve C1). That is, the bottom electrode layer 170 is non-uniformly disposed over the wafer 110. As such, this nonuniformity of the bottom electrode layer 170 would cause a re-deposition process during subsequent etching processes (e.g., etching process in FIG. 7). Therefore, some embodiments of the present disclosure provide methods for improving the deposition uniformity of the bottom electrode layer 170.

As shown in FIG. 4, FIG. 11, and FIG. 12, the rotation axis RA is spaced apart (or offset) from the center axis MA of the magnet 1130, and the uniformity of the bottom electrode layer 170 formed over the wafer 110 can be improved. In greater details, the center axis MA is separated from the rotation axis RA by an offset distance D, and due to the magnetic field adjustment by the magnet 1130, the deposition amount of the central region of the bottom electrode layer 170 and the deposition amount of the edge region of the bottom electrode layer 170 are decreased (curve C2). In some embodiments, the uniformity of the bottom electrode layer 170 can be improved up to 50%. That is, the thickness reduction of the bottom electrode layer 170 at the center or the edges of the wafer 110 in the curve C2 is up to about 50% of the thickness of the bottom electrode layer 170 at the center or the edges of the wafer 110 in the curve C1. In some embodiments, the offset distance D between the center axis MA and the rotation axis RA is greater than 0 mm and less than or equal to about 100 mm. If the offset distance D is greater than 100 mm, magnetic field lines of the magnet 1130 would be reversed, thereby causing the thickness of the central region/edge region of the bottom electrode layer 170 increased. In some other embodiments, the offset distance D between the center axis MA and the rotation axis RA is greater than 0 mm and less than or equal to about 10 mm. In some embodiments, a ratio of the offset distance D to a width W1 of the wafer 110 is greater than 0 and less than or equal to about 0.66. If the ratio of the offset distance D to the width W1 of the wafer 110 is out of this range, the magnetic field lines of the magnet 1130 would be reversed, thereby causing the thickness of the central region/edge region of the bottom electrode layer 170 increased. In some embodiments, the central region of the bottom electrode layer 170 or the edge region of the bottom electrode layer 170 has a maximum thickness, and the other regions of the bottom electrode layer 170 has a minimum thickness. In other words, a thickness of the central region of the bottom electrode layer 170 or a thickness of the edge region of the bottom electrode layer 170 is greater than a thickness of the other regions of the bottom electrode layer 170. In some embodiments, a thickness difference TD (see FIG. 12) between the maximum thickness (e.g., the thickness of the central region or the edge region) of the bottom electrode layer 170 and the minimum thickness (e.g., a thickness of the other regions) of the bottom electrode layer 170 is in a range of about 0 nm to about 10 nm. For example, the maximum thickness is about 26 nm, and the minimum thickness is about 24 nm. In some embodiments, since the rotation axis RA is spaced apart from the center axis MA of the magnet holder 1132 (or of the magnet 1130), the thickness of the bottom electrode layer 170 is substantially unchanged during the period of the deposition process (e.g., from 0 to 10000 kilowatt-hour (kWhr)).

In some embodiments, a width (or a diameter) W2 of the magnet 1130 is substantially equal to a width (or a diameter) W3 of the target 1114. Since the center axis MA of the magnet 1130 is spaced apart from the rotation axis RA, a portion 1130a of the magnet 1130 does not overlap with the target 1114 in a vertical direction VD. Also, a portion 1114a of the target 1114 does not overlap with the magnet 1130 in the vertical direction VD. Specifically, a vertical projection of the portion 1130a of the magnet 1130 on the carrier structure 1112 is spaced apart from a vertical projection of the target 1114 on the carrier structure 1112. Also, a vertical projection of the portion 1114a of the target 1114 on the carrier structure 1112 is spaced apart from a vertical projection of the magnet 1130. It is noted that the "vertical" herein is referred as a direction perpendicular to a lengthwise direction of the wafer 110, and the "vertical" is substantially parallel to the center axis MA and/or the rotation axis RX.

Figure 5:
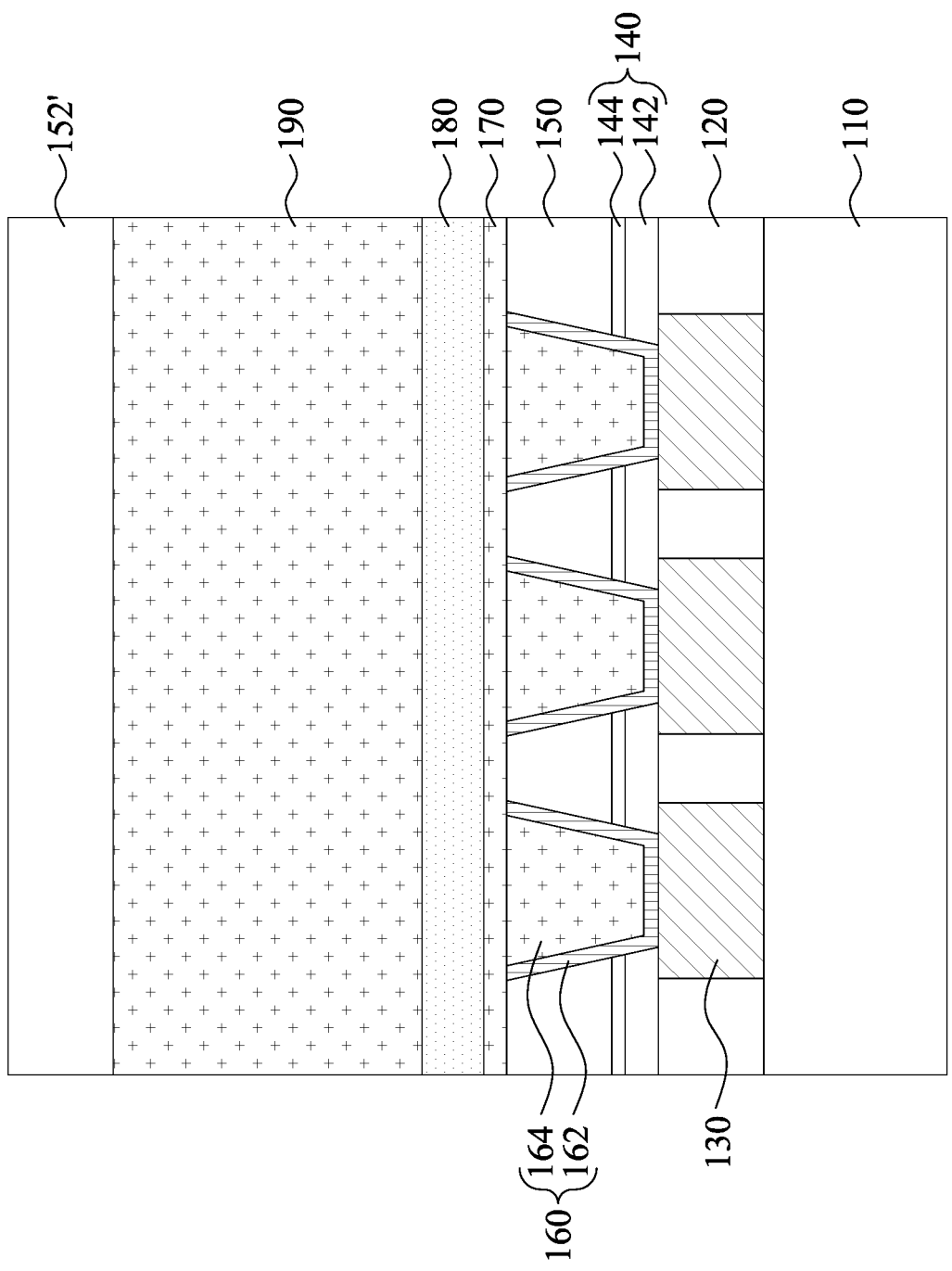

Reference is made to FIG. 5. A memory material layer 180 is formed over structure in FIG. 4. In other words, the memory material layer 180 covers the bottom electrode layer 170. In some embodiments, the memory material layer 180 includes copper (Cu), aluminum (Al), tantalum (Ta), tungsten (W), tantalum nitride (TaN), titanium, titanium nitride (TiN), the like, and/or a combination thereof. In some embodiments, the memory material layer 180 may be formed by a suitable technique, such as atomic layer deposition (ALD). Other chemical vapor deposition (CVD) techniques may be used. In another example, the memory material layer 180 may be formed by a physical vapor deposition (PVD), such as a sputtering process with a metallic target and with a gas supply to the PVD chamber. In yet another example, the memory material layer 180 may be formed an electron-beam deposition process.

In some embodiments, the memory material layer 180 is (a) magnetic tunnel junction (MTJ) layer(s). The MTJ layer(s) may include various layers formed of different combinations of materials. In some embodiments, the MTJ layer(s) include a pinning layer, a tunnel barrier layer, and a free layer. In addition, the MTJ layer(s) may have other variations including other layers, such as anti-ferro-magnetic layers. In some embodiments, the pinning layer is formed of PtMn, the tunnel barrier layer is formed of MgO, and the free layer is formed of CoFeB. The magnetic moment of the free layer may be programmed causing the resistance of the resulting MTJ cell to be changed between a high resistance and a low resistance. It is realized that MTJ layer(s) may have many variations, which are also within the scope of the present disclosure.

After the memory material layer 180 is formed, a top electrode layer 190 is formed over the memory material layer 180. The top electrode layer 190 covers the memory material layer 180. In some embodiments, the top electrode layer 190 includes copper (Cu), aluminum (Al), tantalum (Ta), tungsten (W), tantalum nitride (TaN), titanium, titanium nitride (TiN), the like, and/or a combination thereof. In some embodiments, the bottom electrode layer 170 and the top electrode layer 190 include the same materials, such as TiN. In some embodiments, the top electrode layer 190 may be formed by a CVD process, a PVD process, an ALD process, the like, and/or a combination thereof.

A mask layer 152' is then formed over the top electrode layer 190. The mask layer 152' covers the top electrode layer 190. The mask layer 152' may be made of low-k dielectric material, such as tetraethylorthosilicate (TEOS)-formed oxide, or other suitable materials. In some embodiments, the mask layer 152' includes silicon oxide layer, silicon nitride layer or silicon oxynitride layer, and the like. The mask layer 152' may be formed by CVD, plasma enhanced CVD (PECVD), ALD, flowable CVD (FCVD), or other suitable methods.

Figure 6:
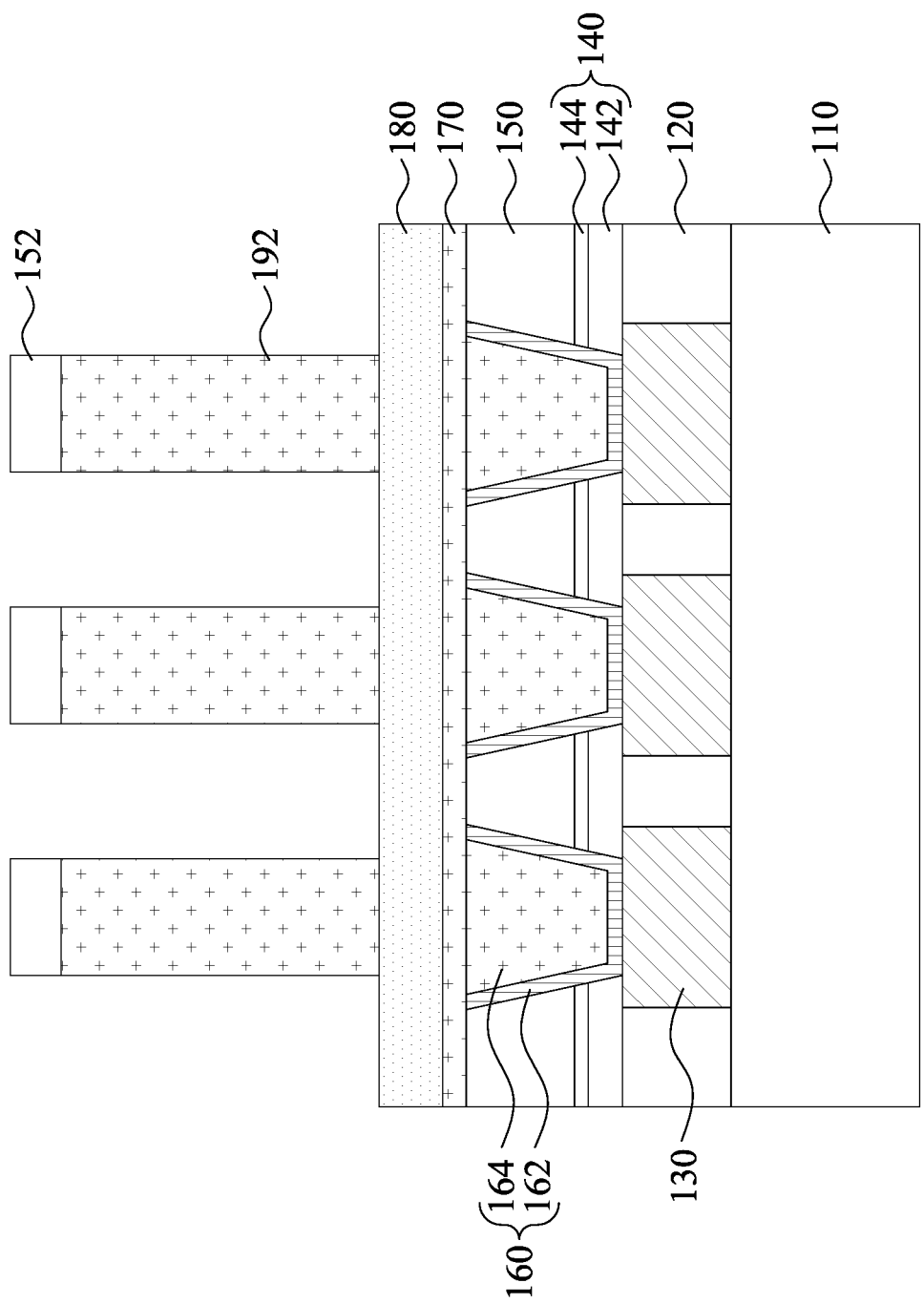

Reference is made to FIG. 6. The mask layer 152' of FIG. 5 is patterned to be a plurality of masks 152. Subsequently, the top electrode layer 190 of FIG. 5 is patterned by using the masks 152 as etch masks to form a plurality of top electrodes 192. In some embodiments, a patterned photoresist layer is formed over the mask layer 152' and aligned to the bottom electrode vias 160, and the mask layer 152' of FIG. 5 is patterned by using the patterned photoresist layer as an etch mask. As such, the patterned top electrodes 192 and the patterned masks 152 are substantially aligned with the underlying bottom electrode vias 160.

In some embodiments, the etching process may use either dry or wet etching. When dry etching is used, the process gas may include $CF_4$, $CHF_3$, $NF_3$, $SF_6$, $Br_2$, HBr, $Cl_2$, or combinations thereof. Diluting gases such as $N_2$, $O_2$, or Ar may optionally be used. When wet etching is used, the etching solution (etchant) may include $NH_4OH$:$H_2O_2$:$H_2O$ (APM), $NH_2OH$, KOH, $HNO_3$:$NH_4F$:$H_2O$, and/or the like.

Figure 7:
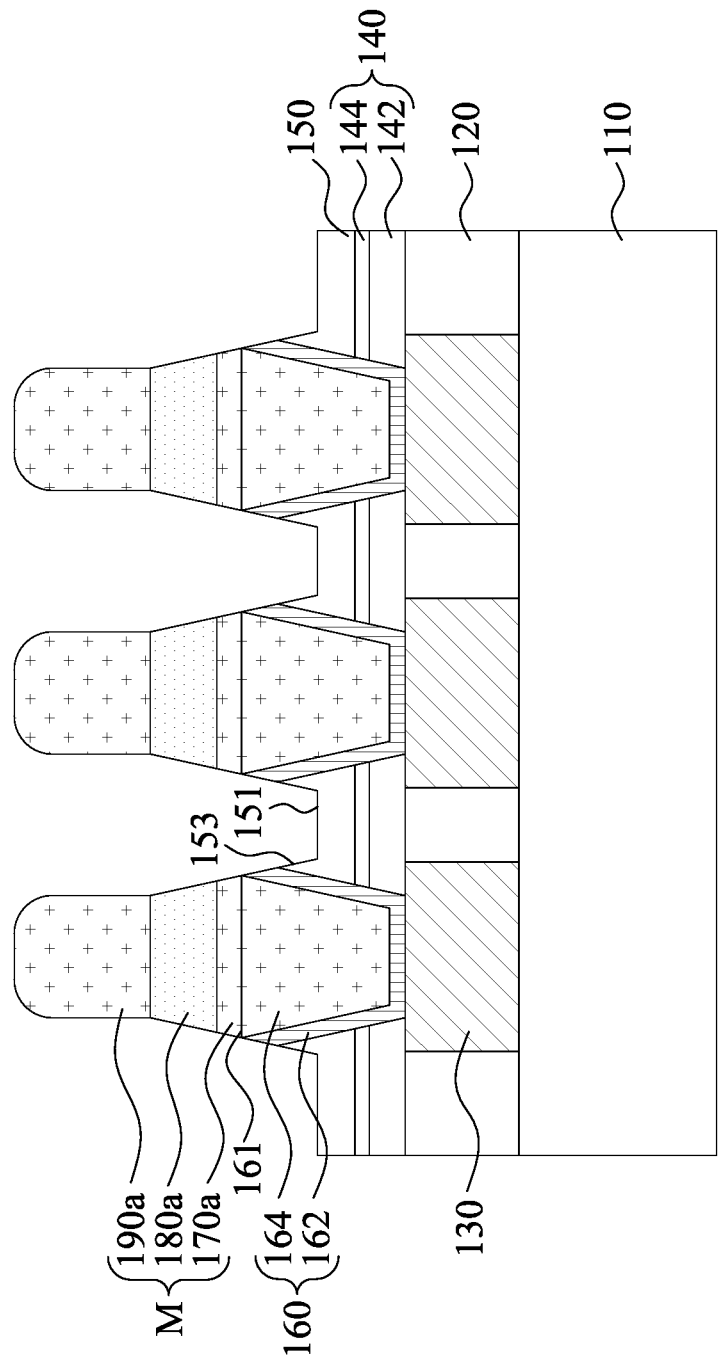

Reference is made to FIG. 6 and FIG. 7. An etching process is performed to pattern the bottom electrode layer 170 and the memory material layer 180. The masks 152 are removed to expose underlying top electrodes 192, and the memory material layer 180 is patterned to form memory layers 180a using the top electrodes 192 of FIG. 6 as etch masks, and the bottom electrode layer 170 is patterned to form bottom electrode 170a using the top electrodes 192 as etch masks. The etching process stops when the dielectric structure 150 is recessed. That is, recesses are formed in the dielectric structure 150 to separate adjacent bottom electrode vias 160. In some embodiments, the etching process may use ion beam etching process. The ion beam etching process may consume the masks 152 and the top electrodes 192 such that the top electrodes 192 are consumed to be top electrodes 190a. The process ion of the ion beam etching may include inert gases, such as Ar.

Since the bottom electrode layer 170 (see FIG. 4) is formed uniformly over the wafer 110, the re-deposition issue during the etching process can be avoided. Specifically, if the bottom electrode layer 170 is formed non-uniformly (e.g., a portion of the bottom electrode layer 170 at the edge of the wafer is thicker than other portions of the bottom electrode layer 170), the etching process removes more materials of the bottom electrode layer 170 at the edge of the wafer 110, and these materials may not be removed efficiently and be re-deposited on the sidewalls of the memory cells M up to about 100-nm thickness, thereby causing high bit error rate (BER) in the re-deposited memory cells M. In FIG. 7, however, since the bottom electrode layer 170 has uniform thickness due to the off-axis rotation of the magnet 1130 (see FIG. 11), sidewalls of the memory layer 180a are free of the etched materials of the bottom electrode layer 170, and thus high BER can be prevented or avoided. The performance of the memory device can be also improved. In some embodiments, an amount of the bottom electrode layer re-deposited on the memory layer 180a can be decreased. The amount of the re-deposited bottom electrode layer can be neglected and would not adversely affect the performance of the memory device.

In some embodiments, the dielectric structure 150 has a (flat) bottom surface 151 and a sidewall 153 extending from the bottom surface 151 to the barrier layer 162 of the bottom electrode via 160. In some embodiments, the bottom electrode 170a and the memory layer 180a form a trapezoid profile, and the top electrode 190a has a curved top surface due to the etching process described in FIG. 7. In some embodiments, the etching process is performed such that the bottom surface 151 of the dielectric structure 150 is lower than a top surface 161 of the bottom electrode via 160.

In some embodiments, the bottom electrode 170a, the memory layer 180a, and the top electrode 190a are referred as a memory cell M. In some embodiments, the memory layer 180a may be referred to be an MTJ stack.

Figure 8:
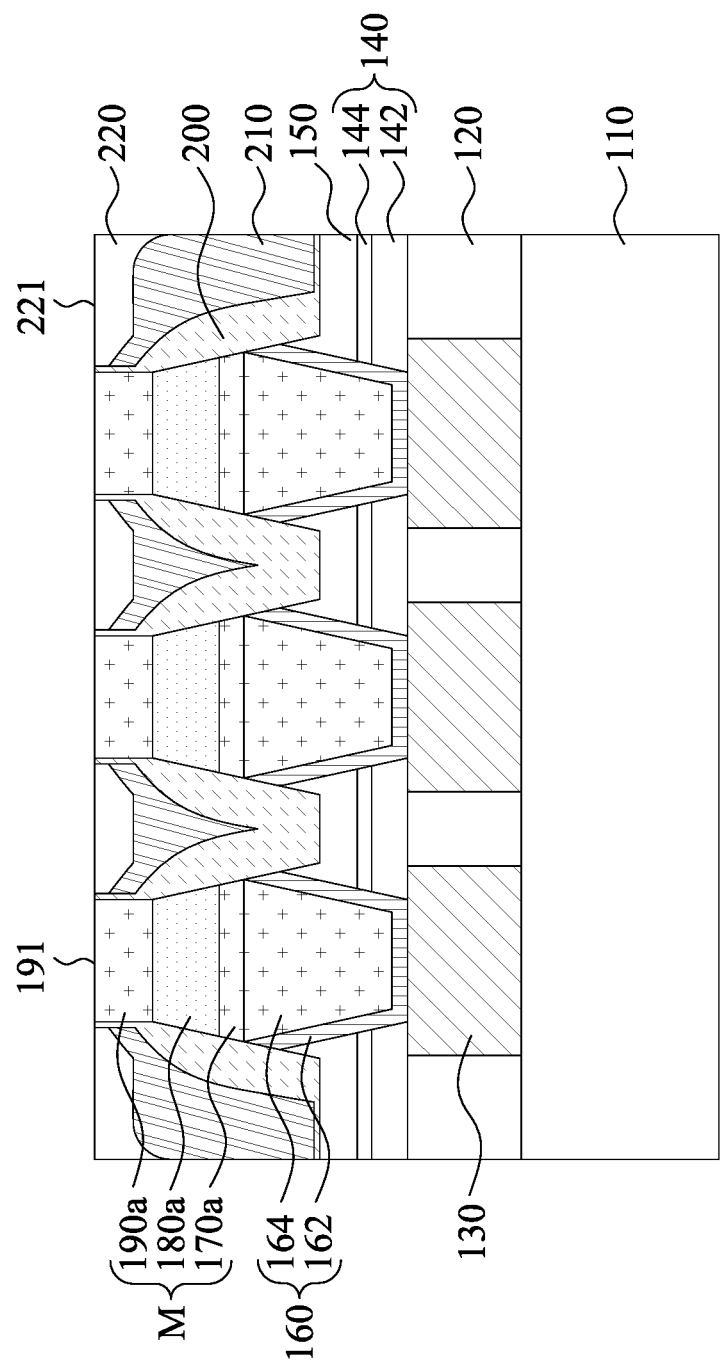

Reference is made to FIG. 7 and FIG. 8. Spacer structures 200 are formed on sidewalls of the bottom electrode 170a, the memory layer 180a, and the top electrode 190a. In some embodiments, the spacer structures 200 are in contact with the dielectric structure 150 and the barrier layer 162 of the bottom electrode via 160. The spacer structures 200 extend upward form the dielectric structure 150 to the top electrode 190a. The spacer structures 200 are configured to prevent the memory cells M from oxidization.

In some embodiments, the spacer structures 200 include metal oxide, such as magnesium oxide (MgO). In some other embodiments, the spacer structures 200 include silicon oxide, silicon nitride, silicon carbide nitride (SiCN), silicon oxynitride (SiON), silicon carbide oxynitride (SiCON), or other suitable dielectric material. In some embodiments, the spacer structures 200 include a first spacer layer conformally formed on the structure of FIG. 7 and a second spacer layer over the first spacer layer. The spacer structures 200 may be formed by deposition and etching processes. The deposition process may be a chemical vapor deposition (CVD), physical vapor deposition (PVD), atomic layer deposition (ALD), or other suitable deposition techniques. The etching process may be an anisotropic dry etching process in one example.

After the spacer structures 200 are formed, an etch stop layer 210 is formed over the spacer structures 200. The etch stop layer 210 is separated from the memory cell M by the spacer structures 200. In other embodiments, the etch stop layer 210 includes nitride. For example, the etch stop layer 210 includes metal nitride such as aluminum nitride. The etch stop layer 210 may include materials such as oxynitrides. In yet some other embodiments, the etch stop layer 210 has a composite structure including a plurality of layers, such as a silicon nitride layer overlying a silicon oxide layer. The etch stop layer 210 can be formed using plasma enhanced CVD (PECVD), however, other suitable methods, such as low pressure CVD (LPCVD), atomic layer deposition (ALD), and the like, can also be used.

After the etch stop layer 210 is formed, a dielectric structure 220 is formed over the etch stop layer 210. The dielectric structure 220 may be made of low-k dielectric material, such as tetraethylorthosilicate (TEOS)-formed oxide, or other suitable materials. In some embodiments, the dielectric structure 220 includes silicon oxide layer, silicon nitride layer or silicon oxynitride layer, and the like. The dielectric structure 220 may be formed by CVD, plasma enhanced CVD (PECVD), ALD, flowable CVD (FCVD), or other suitable methods.

Thereafter, a planarization process is performed to remove portions of the top electrodes 190a and the dielectric structure 220, such that top surfaces 191 of the top electrodes 190a is substantially coplanar with a top surface 221 of the dielectric structure 220. In some embodiments, the etch stop layer 210 is formed covering the top electrodes 190a and then the dielectric structure 220 is formed covering the etch stop layer 210. As such, the planarization process is performed to remove a portion of the etch stop layer 210 such that the top surfaces 191 of the top electrodes 190a are exposed. In some embodiments, the planarization process is a chemical mechanical planarization (CMP) process.

Figure 9:
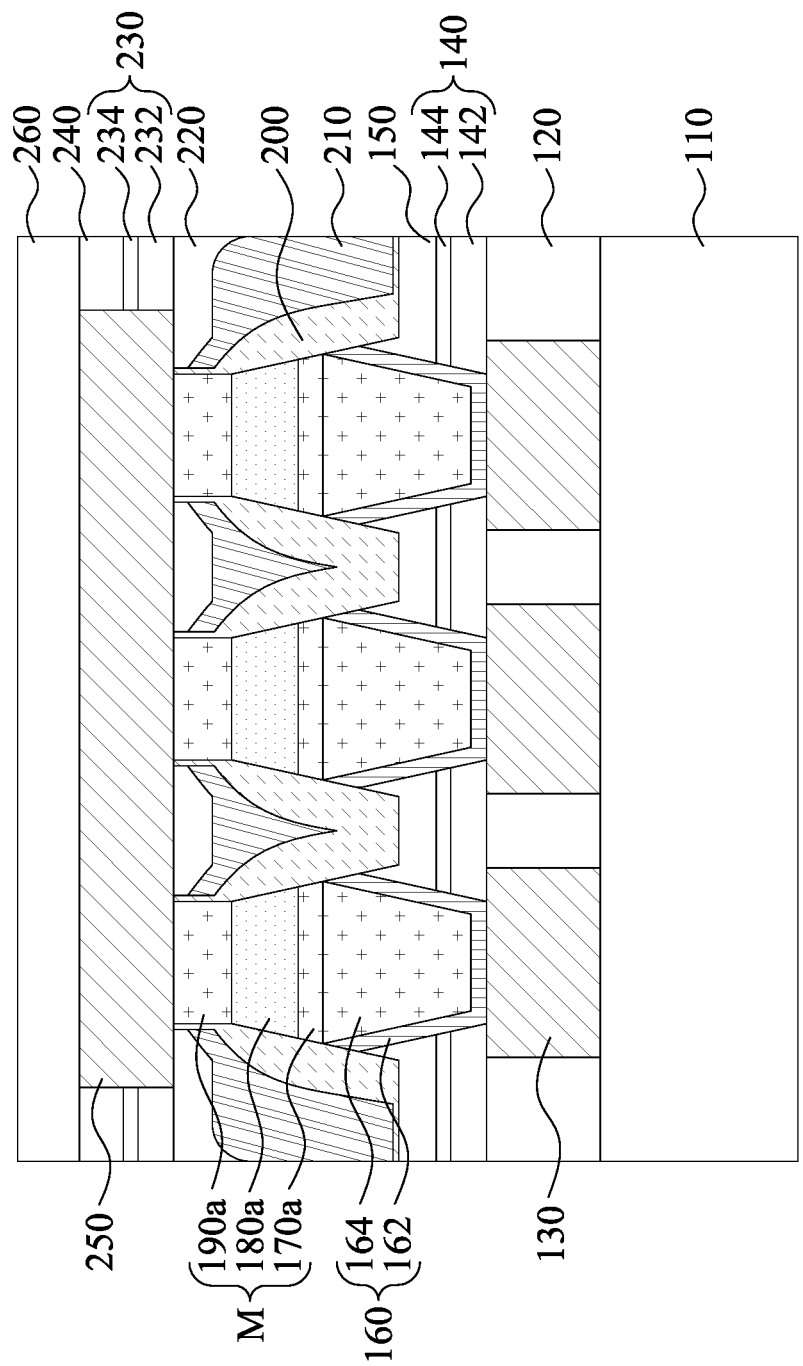

Reference is made to FIG. 9. A blocking layer 230 is formed over structure of FIG. 8. Specifically, the blocking layer 230 is formed over the top electrode 190a, the spacer structures 200, and the dielectric structure 220. The blocking layer 230 is formed by a suitable process such as physical vapor deposition (PVD), sputtering, chemical vapor deposition (CVD), atomic layer deposition (ALD), or combinations thereof. In some embodiments, the blocking layer 230 is a bilayer structure. For example, the blocking layer 230 includes a first blocking layer 232 and a second blocking layer 234 over the first blocking layer 232. The first blocking layer 232 may be a silicide-blocking layer, and may also be referred to as a silicidation-blocking layer. The first blocking layer 232 may include a dielectric material such as silicon oxide, silicon nitride, or other suitable materials. The second blocking layer 234 may include metal oxide, such as aluminum oxide, or other suitable materials. In some embodiments, the first blocking layer 232 has a thickness greater than that of the second blocking layer 234. In some embodiments, the first blocking layer 142 of the blocking layer 140 and the first blocking layer 232 of the blocking layer 230 include the same materials.

After the blocking layer 230 and the dielectric structure 240 are formed, a conductive layer 250 is formed in the blocking layer 230 and the dielectric structure 240. In some embodiments, the method of forming the conductive layer 250 may include etching the blocking layer 230 and the dielectric structure 240 to form an opening, and then filling conductive materials into the opening to form the conductive layer 250. In some embodiments, a planarization process, such as a CMP process, may be performed to remove excess materials. In some embodiments, the conductive layer 250 includes copper or copper alloys. In some other embodiments, the conductive layer 250 includes aluminum, tungsten, carbon, cobalt, TaN, or other suitable conductive materials. In some embodiments, the conductive layer 250 and the conductive features 130 include the same materials, such as copper.

Thereafter, a protective layer 260 is formed over the blocking layer 230. The protective layer 260 is formed by a suitable process such as physical vapor deposition (PVD), sputtering, chemical vapor deposition (CVD), atomic layer deposition (ALD), or combinations thereof. The protective layer 260 may be a silicide-blocking layer, and may also be referred to as a silicidation-blocking layer. The protective layer 260 may include a dielectric material such as silicon oxide, silicon nitride, or other suitable materials. Alternatively, the protective layer 260 may include an organic material, a polymer or combinations thereof. The organic material is, for example, benzocyclobutene (BCB), and the polymer is, for example, polyimide (PI). In some embodiments, the first blocking layer 142 of the blocking layer 140, the first blocking layer 232 of the blocking layer 230, and the protective layer 260 include the same materials.

Figure 10:
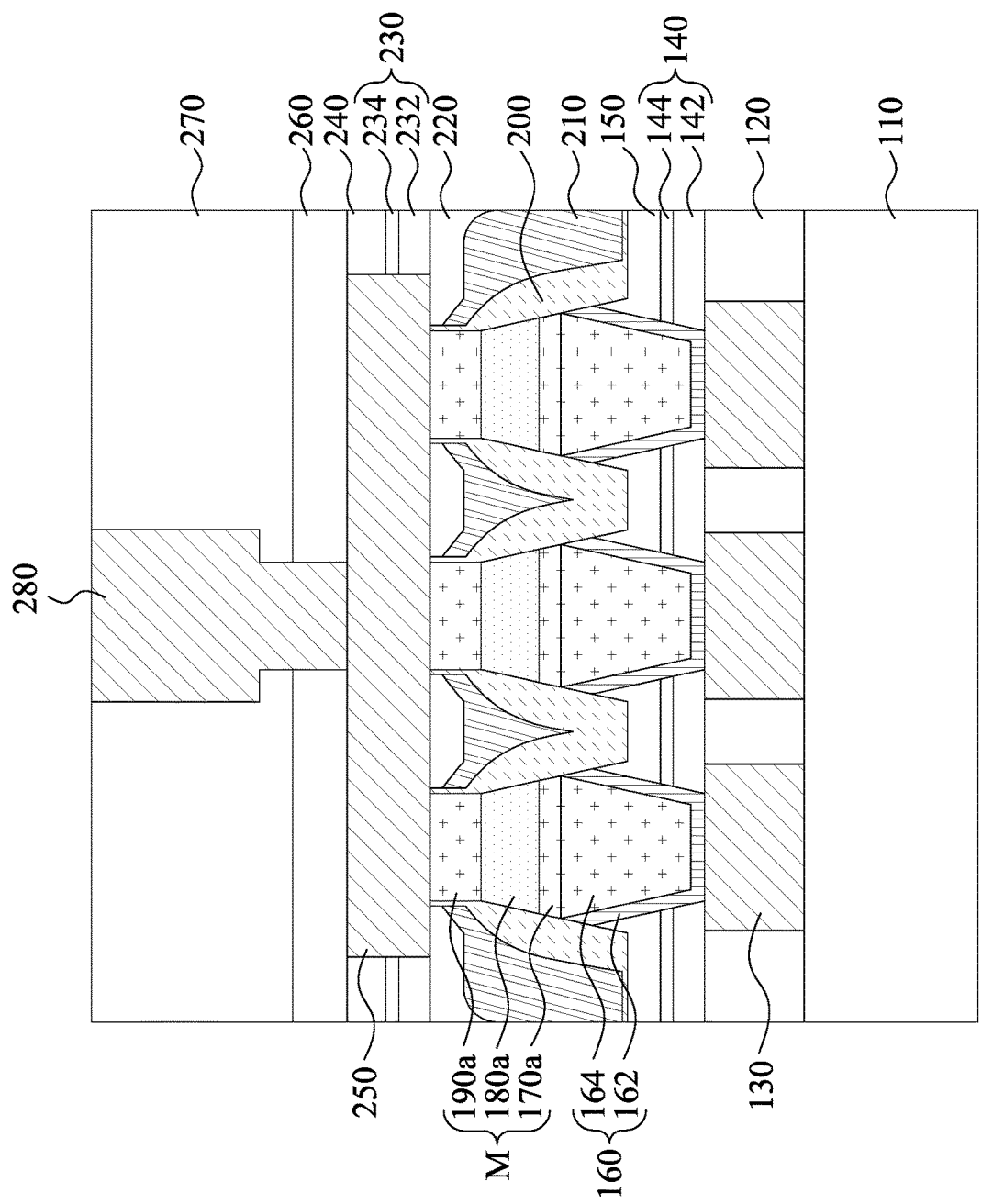

Reference is made to FIG. 10. A dielectric layer 270 is deposited over the protective layer 260. In some embodiments, the dielectric layer 270 may include the same materials as the dielectric layer 120. In some other embodiments, the dielectric layer 270 may include the same materials as either the dielectric structure 240 or the dielectric structure 220. The dielectric layer 270 may include, for example, silicon oxide, low-k silicon oxide such as a porous silicon oxide layer, other suitable dielectric material, combinations thereof, or the like. The dielectric layer 270 may be formed by CVD, high-density plasma CVD, spin-on, sputtering, or other suitable methods.

After the dielectric layer 270 is formed, a top electrode via 280 is formed in the protective layer 260 and the dielectric layer 270. In some embodiments, the method of forming the top electrode via 280 may include etching and deposition processes. The etching processes include etching the dielectric layer 270 to form a first opening and etching the dielectric layer 270 and the protective layer 260 to form a second opening communicated to the first opening. The deposition process includes filling conductive materials into the first and second openings to form the top electrode via 280. In some embodiments, a planarization process, such as a CMP process, may be performed to remove excess materials. The top electrode via 280 is electrically connected to the top electrodes 190a through the conductive layer 250. In some embodiments, the top electrode via 280 may be made of metal, such as tungsten (W), cobalt (Co), ruthenium (Ru), aluminum (Al), copper (Cu), or other suitable materials. In some embodiments, the top electrode via 280 and the conductive layer 250 include the same materials, such as copper.

In some embodiments, the top electrode via 280 includes a barrier layer and a metal filling layer over the barrier layer. The configuration and materials of the barrier layer of the top electrode via 280 is similar or the same as that of the bottom electrode via 160 (e.g., the barrier layer 162), and configuration and materials of the metal filling layer of the top electrode via 280 is similar or the same as that of the bottom electrode via 160 (e.g., the metal filling layer 164).

In some embodiments, the memory device in FIG. 10 includes the wafer 110, the conductive features 130, the bottom electrode vias 160, and the memory cells M. The conductive features 130 are disposed over the wafer 110. The bottom electrode vias 160 are disposed over the conductive features 130. The memory cells M are disposed over bottom electrode vias 160 and each of the memory cells M includes the bottom electrode 170a, the memory layer 180a, and the top electrode 190a. The bottom electrode 170a is disposed over and connected to the bottom electrode vias 160. The memory layer 180a is disposed over the bottom electrode 170a. The top electrode 190a is disposed over the memory layer 180a.

In some embodiments, the bottom electrode 170a is in contact with the bottom electrode vias 160. Each of the bottom electrode vias 160 includes the barrier layer 162 and the metal filling layer 164. The memory layer 180a may be referred as an MTJ stack.

In some embodiments, the memory device further includes the spacer structures 200 disposed on sidewalls of the bottom electrode 170a, the memory layer 180a, and the top electrode 190a. In some embodiments, the spacer structures 200 are direct in contact with the memory layer 180a. In other words, the spacer structures 200 and the memory layer 180a do not have the bottom electrode layer therebetween.

In some embodiments, the memory device further includes conductive layer 250 covering the top electrodes 190a. In some embodiments, the memory device further includes the top electrode via 280 on the conductive layer 250. The top electrode via 280 is electrically connected to the top electrode 190a through the conductive layer 250. The top electrode via 280 and the conductive layer 250 may include the same materials.

In some embodiments, the memory device further includes the dielectric layer 120 over the wafer 110. The memory device further includes the blocking layer 140 and the dielectric structure 150 over the dielectric layer 120. The blocking layer 140 and the dielectric structure 150 surround the bottom electrode vias 160. The blocking layer 140 has the first blocking layer 142 and the second blocking layer 144 over the first blocking layer 142, in which the first blocking layer 142 is in contact with the dielectric layer 120.

In some embodiments, the memory device further includes the etch stop layer 210 and the dielectric structure 220. The etch stop layer 210 is disposed over the spacer structures 200, and the dielectric structure 220 is disposed over the etch stop layer 210. In some embodiments, the memory device further includes the blocking layer 230 and the dielectric structure 240 over the blocking layer 230. The configuration and materials of the blocking layer 230 is similar or the same as that of the blocking layer 140. For example, the blocking layer 230 has the first blocking layer 232 and the second blocking layer 234 over the first blocking layer 232, in which the first blocking layer 232 is in contact with the dielectric structure 220.

In some embodiments, the memory device further includes the protective layer 260 and the dielectric layer 270 over the conductive layer 250, in which the dielectric layer 270 is disposed over the protective layer 260. The protective layer 260 and the dielectric layer 270 surround the top electrode via 280.

Based on the above discussions, it can be seen that the present disclosure offers advantages. It is understood, however, that other embodiments may offer additional advantages, and not all advantages are necessarily disclosed herein, and that no particular advantages are required for all embodiments. One advantage is that the method of forming bottom electrode layer (e.g., the rotation axis is spaced apart from the center axis of the magnet in some cases) are beneficial to form the bottom electrode layer uniformly over the wafer. As such, the re-deposition process during the etching process can be avoided. Further, high bit error rate (BER) can be prevented or avoided. The performance of the memory device can be also improved.

According to some embodiments, a method of forming a memory device includes forming a dielectric structure over a wafer. A bottom electrode via is formed in the dielectric structure. A plasma deposition process is performed to deposit a bottom electrode layer over the bottom electrode and performing the plasma deposition process includes off-axis rotating a magnet over the wafer to control plasma of the plasma deposition process. A memory material layer and a top electrode layer are formed over the bottom electrode layer. The bottom electrode layer, the memory material layer, and the top electrode layer are patterned to respectively form a bottom electrode, a memory layer, and a top electrode.

According to some embodiments, a method of forming a bottom electrode via over a wafer. A bottom electrode layer is deposited over the bottom electrode via by using a deposition apparatus, in which the deposition apparatus includes a target and a magnet, and a portion of the magnet does not overlap with the target in a vertical direction. A magnetic tunnel junction (MTJ) layer and a top electrode layer are formed over the bottom electrode layer. The bottom electrode layer, the MTJ layer, and the top electrode layer are patterned to respectively form a bottom electrode, a memory layer, and a top electrode.

According to some embodiments, a deposition apparatus includes a chamber, a wafer pedestal, a carrier structure, and a magnet. The chamber is surrounded by a shield structure. The wafer pedestal is configured to support a wafer within the chamber. The carrier structure is positioned over the chamber, and the carrier structure configured to support a target. The magnet is positioned above the chamber, in which a center of the magnet is spaced apart from a center of the chamber.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a dielectric structure over a wafer;
    forming a first bottom electrode via and a second bottom electrode via in the dielectric structure;
    performing a plasma deposition process to deposit a bottom electrode layer over the first and second bottom electrode vias, performing the plasma deposition process comprising off-axis rotating a magnet over the wafer to control plasma of the plasma deposition process, wherein the magnet comprises an electromagnetic coil;
    forming a memory material layer and a top electrode layer over the bottom electrode layer;
    patterning the bottom electrode layer, the memory material layer, and the top electrode layer to respectively form a first bottom electrode, a first memory layer, and a first top electrode of a first memory cell over the first bottom electrode via and a second bottom electrode, a second memory layer, and a second top electrode of a second memory cell over the second bottom electrode via;
    forming a continuous conductive line over the first top electrode of the first memory cell and the second top electrode of the second memory cell, wherein the continuous conductive line is in direct contact with the first top electrode of the first memory cell and the second top electrode of the second memory cell; and
    forming a top electrode via over the continuous conductive line, such that the top electrode via is electrically connected to the first and second top electrodes through the continuous conductive line.

2. The method of claim 1, wherein a center of the magnet is separated from a center of the wafer by a distance greater than 0 and less than 100 mm.

3. The method of claim 1, wherein patterning the bottom electrode layer, the memory material layer, and the top electrode layer is performed such that a sidewall of the memory material layer is free of an etched material of the bottom electrode layer.

4. The method of claim 1, wherein the plasma deposition process is a physical vapor deposition.

5. The method of claim 1, wherein patterning the bottom electrode layer, the memory material layer, and the top electrode layer are performed by using an ion beam etching process.

6. The method of claim 1, further comprises:
    forming a spacer structure on sidewalls of the first bottom electrode, the first memory layer, and the first top electrode.

7. The method of claim 6, wherein the spacer structure is formed such that the spacer structure is in contact with the first bottom electrode via.

8. The method of claim 1, wherein a length of the continuous conductive line is greater than a width of the top electrode via in a cross-sectional view.

9. The method of claim 1, wherein the magnet further comprises a permanent magnet.

10. The method of claim 1, wherein the memory material layer is a magnetic tunnel junction (MTJ) layer.

11. A method, comprising:
    forming a bottom electrode via over a wafer;
    depositing a bottom electrode layer over the bottom electrode via by using a deposition apparatus, wherein the deposition apparatus comprises a target, a magnet, and a magnet holder supporting the magnet and disposed between the target and the magnet, a portion of the magnet and a portion of the magnet holder are free from overlapping with the target in a vertical direction;

forming a magnetic tunnel junction (MTJ) layer and a top electrode layer over the bottom electrode layer; and patterning the bottom electrode layer, the MTJ layer, and the top electrode layer to respectively form a bottom electrode, a memory layer, and a top electrode.

12. The method of claim 11, wherein the deposition apparatus further includes a carrier structure, and wherein the target and the magnet are disposed on opposite sides of the carrier structure.

13. The method of claim 11, wherein a width of the target is substantially equal to a width of the magnet.

14. The method of claim 11, wherein a distance between a center of the target and a center of the magnet is greater than 0 mm and less than 100 mm.

15. The method of claim 11, wherein depositing a bottom electrode layer is performed such that a thickness difference between a maximum thickness and a minimum thickness of the bottom electrode layer is in a range of 0 nm to 10 nm.

16. The method of claim 11, wherein patterning the bottom electrode layer, the MTJ layer, and the top electrode layer are performed such that a dielectric structure surrounding the bottom electrode via has a bottom surface.

17. The method of claim 16, wherein the bottom surface of the dielectric structure is lower than a top surface of the bottom electrode via.

18. A deposition apparatus, comprising:
a chamber surrounded by a shield structure;
a wafer pedestal configured to support a wafer within the chamber;
a carrier structure positioned over the chamber, and the carrier structure configured to support a target;
a magnet positioned above the chamber, wherein a center of the magnet is spaced apart from a center of the chamber; and
a magnet holder between the magnet and the carrier structure, wherein the magnet holder is in contact with a surface of the magnet facing the carrier structure and a surface of the carrier structure facing the magnet.

19. The deposition apparatus of claim 18, wherein the magnet holder is further configured to rotate the magnet, and a rotation axis of the magnet holder is spaced apart from the center of the magnet.

20. The deposition apparatus of claim 18, wherein a distance between the center of the magnet and the center of the chamber is greater than 0 mm and less than 100 mm.

* * * * *